(12) United States Patent
Waffenschmidt et al.

(10) Patent No.: US 7,417,523 B2
(45) Date of Patent: Aug. 26, 2008

(54) ULTRA-THIN FLEXIBLE INDUCTOR

(75) Inventors: Eberhard Waffenschmidt, Aachen (DE); Bernd Ackermann, Aachen (DE); Markus Wille, Bönen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/569,127

(22) PCT Filed: Aug. 24, 2004

(86) PCT No.: PCT/IB2004/051541

§ 371 (c)(1),
(2), (4) Date: Feb. 22, 2006

(87) PCT Pub. No.: WO2005/020254

PCT Pub. Date: Mar. 3, 2005

(65) Prior Publication Data
US 2006/0290460 A1   Dec. 28, 2006

(30) Foreign Application Priority Data
Aug. 26, 2003   (EP) .................. 03102648

(51) Int. Cl.
*H01F 5/00* (2006.01)
*H01F 7/06* (2006.01)
(52) U.S. Cl. ............. 336/200; 29/602.1; 336/223; 336/232
(58) Field of Classification Search ............. 336/200, 336/223, 232; 29/602.1, 605, 606
See application file for complete search history.

(56) References Cited

U.S. PATENT DOCUMENTS

| 4,692,604 | A |   | 9/1987  | Billings |
|---|---|---|---|---|
| 4,701,767 | A | * | 10/1987 | Imai et al. .................. 346/74.2 |
| 6,067,002 | A | * | 5/2000  | Fujino et al. ................. 336/200 |
| 6,351,204 | B1 | * | 2/2002 | Yamasawa et al. .......... 336/200 |
| 6,882,261 | B2 | * | 4/2005 | Moro et al. .................. 336/200 |
| 2002/0167783 | A1 |  | 11/2002 | Waffenschmidt |
| 2002/0196119 | A1 |  | 12/2002 | Meigs et al. |
| 2003/0030533 | A1 |  | 2/2003  | Waffenschmidt |
| 2003/0076211 | A1 | * | 4/2003 | Matsuta et al. .............. 336/200 |

FOREIGN PATENT DOCUMENTS

| DE | 2549670    | 5/1976 |
|----|------------|--------|
| EP | 0856855 A2 | 8/1998 |

(Continued)

OTHER PUBLICATIONS

International Search Report of Intl. Application No. PCT/IB2004/051541 Contained in Intl. Publication No. WO2005020254.

(Continued)

*Primary Examiner*—Anh T Mai

(57) ABSTRACT

SMT-components known in the art usually have a thickness of approximately 1 mm and no flexibility. According to the present invention windings for an inductor are realized within a substrate, preferably by using copper layers which are already in the substrate. Then, thin metal sheet layers of high permeable material are laminated on top and bottom of the substrate. These layers are structured and then form the magnetic core of the inductor. Advantageously, an inductor may be provided with a very small building height.

15 Claims, 4 Drawing Sheets

FOREIGN PATENT DOCUMENTS

| | | |
|---|---|---|
| EP | 0 926 689 | 6/1999 |
| EP | 0926689 A2 | 6/1999 |
| EP | 1 288 975 | 3/2003 |
| EP | 1288975 A2 | 3/2003 |
| JP | 11067541 A | 3/1999 |
| JP | 11 067541 | 6/1999 |
| WO | WO 98/50956 | 11/1998 |
| WO | WO9850956 A1 | 11/1998 |

OTHER PUBLICATIONS

Written Opinion of the International Searching Authority for Intl. Application No. PCT/IB2004/051541.

* cited by examiner

ULTRA-THIN FLEXIBLE INDUCTOR

The present invention relates to an inductor and to a method for manufacturing an inductor.

In a great number of today's electrical devices, such as mobile communication devices, voltages are required that differ from a DC-voltage provided for example from a battery. To convert the voltage efficiently, inductors are needed. Today, thin surface mounted (SMT) inductors are used. They are offered by various manufacturers. Such a typical SMT inductor comprises a thin drum made of sintered ferrite. The diameter of the core may be approximately 4.3 mm and the height of the core may be approximately 1 mm. A winding is formed by thin copper wire wound between upper parts and a lower part of the core. Such SMT inductors are usually provided with plastic fixtures with contacts to mount the device to a printed circuit board (PCB).

Due to the fact that a plastic fixture usually needs to be provided and that the core needs to be specially shaped with a gap of a large aspect ratio to accommodate the wire winding, such SMT inductors are complicated to manufacture and rather expensive. In addition to that, due to the additional plastic fixture, a building height of the SMT inductor in the range of 1 mm which is too large for an application in space sensitive applications such as, for example, mobile phones.

It is an object of the present invention to provide an inductor with a reduced thickness.

According to exemplary embodiment of the present invention the above object may be solved with an inductor as set forth in claim 1, comprising a substrate with a first side and a second side, a winding which is embedded in the substrate and a core. The core comprises a first softmagnetic metal sheet and a second softmagnetic metal sheet which are respectively arranged on the first and second sides of the substrate such that the winding is at least partially covered by the first and second metal sheets.

In other words, according to this exemplary embodiment of the present invention, two thin layers of sheet metal are provided on the sides of the substrate including the winding. Thus, advantageously an ultra-thin inductor with integrated windings may be provided. Furthermore, the inductor, according to this exemplary embodiment of the present invention, has a simple design which may be manufactured at reduced costs. No specially shaped drum core needs to be provided. This makes the inductor according to the present invention suitable for mass manufacturing. Also, advantageously, this inductor is very reliable due to the fact that its magnetic core consists of metal sheets provided on the substrate. Increased reliability may also be provided due to the fact that no soldering connections between the inductor and the substrate are necessary.

According to another exemplary embodiment of the present invention as set forth in claim 2, the winding is a structured copper layer in a substrate. According to this exemplary embodiment of the present invention a substrate already containing copper layers such as a PCB may be used. Thus, the winding may be formed during the same processing step during which other circuit structures in the PCB are formed. Thus, the winding is "for free" due to the fact that when providing the other circuit structures, the copper material has to be provided in any case in the substrate and the manufacturing process to structure these copper layers is also necessary in any case.

Furthermore, due to the fact that the winding comprises a structured copper layer in the substrate, complex winding layouts may be obtained, for example, by wet chemical etching. Such complex winding layouts may, for example be necessary to manufacture transformers or intermediate connections. With this, circuit typologies may be possible, whereon the one compiled with a complex winding is used instead of two or more simple inductors. Due to this, advantageously, the component count may be reduced and the size of a circuit comprising such components may be reduced further.

According to another exemplary embodiment of the present invention as set forth in claim 3, the metal sheets are laminated to the first and second sides of the substrate. Due to the lamination of the metal sheets to the substrate, an inductor may be provided which is an integral part of the substrate or PCB. Due to the lamination of the metal sheets to the substrate, an inductor may be provided with an improved reliability. Also, due to the lamination, no soldering interconnections are necessary which further improves the reliability and reduces the costs of manufacturing.

According to another exemplary embodiment of the present invention as set forth in claim 4, the metal sheets are made of a high permeable metal such as µ-metal, amorphous metal or nanocristaline metal. Due to the fact that these high permeable metal sheets are available with a permeability which is larger than 10.000, which is ten times more than typical ceramic ferrite, and which saturation flux density is about five times higher than that of typical ceramic ferrites, the magnetic core, i.e. the metal sheets, may be very thin such that an inductor having a reduced thickness may be provided.

According to another exemplary embodiment of the present invention as set forth in claim 5, the core plates, i.e. the metal sheets, are so close together such that a distance between them can be considered as an air gap in the magnetic path occurring in the core during operation of the inductor. Hence, according to this exemplary embodiment of the present invention preferably thin substrates having a thickness of less than 1.2 mm or less than 1 mm are applied.

According to another exemplary embodiment of the present invention as set forth in claim 6, the substrate is a flexible substrate. Due to this, and due to the fact that the metal sheets are not brittle as, for example, sintered ferrites, a bendable and a flexible inductor may be provided. Furthermore, the small thickness of the magnetic core, according to this exemplary embodiment of the present invention, adds to the flexibility of the inductor.

According to another exemplary embodiment of the present invention as set forth in claim 7, slits are provided in the metal sheets. Advantageously, these slits are arranged such that eddy currents occurring in the metal sheets during operation of the inductor are minimized or prevented. According to an aspect of this exemplary embodiment of the present invention, the slits are arranged perpendicular to the possible eddy current flow direction. Since the used eddy currents usually flow substantially perpendicular to the magnetic field, according to another aspect of this exemplary embodiment of the present invention the slits are arranged substantially parallel to the direction of the magnetic flux occurring in the inductor during operation. Due to this, possible eddy currents are minimized while the slits only have a very small impact on the magnetic flux. In case a circular inductor is provided, according to another aspect of this exemplary embodiment of the present invention, due to the fact that the magnetic flux is radially orientated in the circular inductor, the slits are arranged in radial direction.

According to another exemplary embodiment of the present invention as set forth in claim 8, the number of slits increases radially to the outside of the magnetic core, i.e. to the outside of circular metal sheets. Advantageously, these slits are very narrow.

According to another exemplary embodiment of the present invention as set forth in claim 9, further slits are provided in the metal sheets which are perpendicular to the direction of the magnetic flux occurring in the core during operation of the inductor. Advantageously, these slits may allow to lower the magnetic flux and also the inductivity of the inductor. This may be advantageous in application where it is necessary to prevent the inductor from saturation.

According to another exemplary embodiment of the present invention as set forth in claim 10, a multilayer inductor is provided on a plurality of sheet metals that are respectively stacked on each other. Advantageously this may allow for inductors with a higher magnetic flux in the core. Advantageously, such multilayer inductors according to this exemplary embodiment of the present invention may be manufactured at low costs.

According to another exemplary embodiment of the present invention as set forth in claim 11, the width of the slits provided in the metal sheets is varied in the different layers of metal sheets stacked on each other. According to an aspect of this exemplary embodiment of the present invention, the inner layers are provided with larger slits than the outer layers which, advantageously, may allow for a homogeneous flux distribution in the core.

According to another exemplary embodiment of the present invention as set forth in claim 12, a method of manufacturing an inductor is provided where the first and the second metal sheets are laminated on sides of a substrate comprising a winding embedded in the substrate. Advantageously, according to this exemplary embodiment of the present invention a very simple manufacturing method is provided for manufacturing an ultra-thin inductor. Claims 13 and 14 provide for further exemplary embodiments of the method according to an exemplary embodiment of the present invention as set forth in claim 12.

It may be seen as a gist of an exemplary embodiment of the present invention that an inductor is provided comprising a substrate with an embedded winding and metal sheets arranged on both sides of the substrate forming the core of the inductor. According to an aspect, the winding of the inductors made by copper tracks in the substrate which may be a PCB or a flex foil. Thus, the core may be made by thin high permeable metal sheets which may be structured and laminated to the substrate. Advantageously, this may allow to reduce a building height of the inductor while not enlarging a footprint area compared to known solutions. Furthermore, the costs for manufacturing those inductors may be reduced.

These and other aspects of the present invention will become apparent from and elucidated with reference to the embodiments described hereinafter.

Exemplary embodiments of the present invention will be described in the following, with reference to the following drawings.

Figure 1:
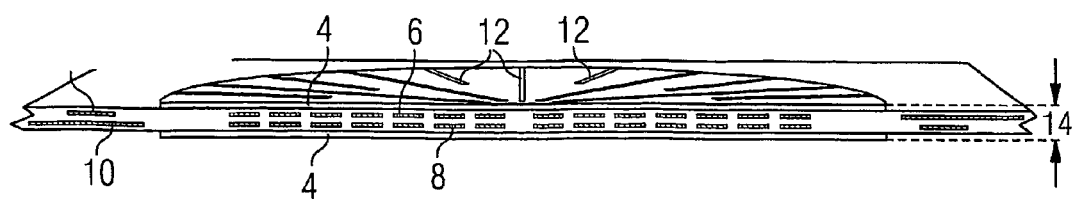
FIG. 1 shows a sectional view of an inductor according to the first exemplary embodiment of the present invention.

FIG. 1 shows a sectional view of a first exemplary embodiment of an inductor according to the present invention comprising a substrate 2 with a first side and second side. Within the substrate 2 there is provided a winding 6 and 8. The winding 6, 8 is embedded in the substrate 2 and thus forms an integral part of the substrate 2. A core of the inductor is formed by softmagnetic metal sheets arranged on the first and second sides of the substrate 2 such that the winding 6, 8 is at least partially covered by the metal sheets 4. The softmagnetic metal sheets 4 arranged on the substrate 2 have a circular shape. The thickness of the metal sheets 4 may be very thin such as in the range of 25 μm to 100 μm. However, it is also possible to use metal sheets having a thickness in the range of 50 μm to 150 μm or 15 μm to 75 μm. The metal sheets may be made of a high permeable metal material with a permeability which may be larger than 10.000. Such permeability is ten times higher than that of typical ceramic ferrites. Furthermore, a flux saturation of this material, according to an aspect of this exemplary embodiment of the present invention, is approximately five times higher than that of ferrites. Advantageously, due to this the magnetic core, i.e. the metal sheets 4 may be made much thinner in comparison to magnetic cores made of sintered ferrites. According to an aspect of this exemplary embodiment of the present invention, the metal sheets 4 are made of a material selected from a group consisting of μ-metal, nanocristaline metal and amorphous metals. All three materials are available from the Vakuumschmelze in Hanau, Germany. As amorphous metal, for example VitroVac may be used which is also available from Vakuumschmelze in Hanau, Germany.

Advantageously, μ-metal is the most well known type. It has only medium hysteresis losses. VitroVac has even lower hysteresis losses and nanocristaline metal has the lowest hysteresis losses of the materials named above and may, therefore, be the material selected for a preferred embodiment of the present invention. From Vakuumschmelze, these materials are available as metal sheets with a thickness varying from 25 μm to 50 μm and up to several 100 μm.

Advantageously, due to the fact that the windings are embedded in the substrate 2, which itself is used as a part of the component, i.e. the inductor, a total building height 14 of the inductor may be reduced significantly in comparison to the conventional SMT component. For example, a total building height 14 of less than a millimeter may be achieved. Even lower building heights with less than 200 μm are feasible.

According to an aspect of this exemplary embodiment of the present invention, the inductor depicted in FIG. 1 has the same length and width as for example a conventional 10 μH SMT inductor. Therefore, the integrated inductor according to this exemplary embodiment of the present invention may immediately be used to replace SMT inductor in the same area. Since as already mentioned above, the thickness of the core sheets 4 may be as low as 0.025 mm, the total thickness may be reduced to 200 μm or even less.

Furthermore, as may be taken from FIG. 1, two inductor layers 6 and 8 are provided which are preferably realized as copper layers.

Figure 2:
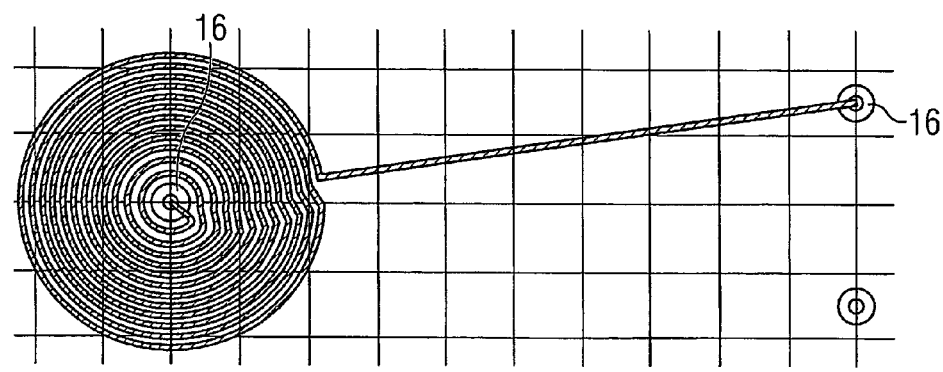
FIG. 2 shows an exemplary embodiment of a winding layout as it may be used in the inductor of FIG. 1.
Figure 3:
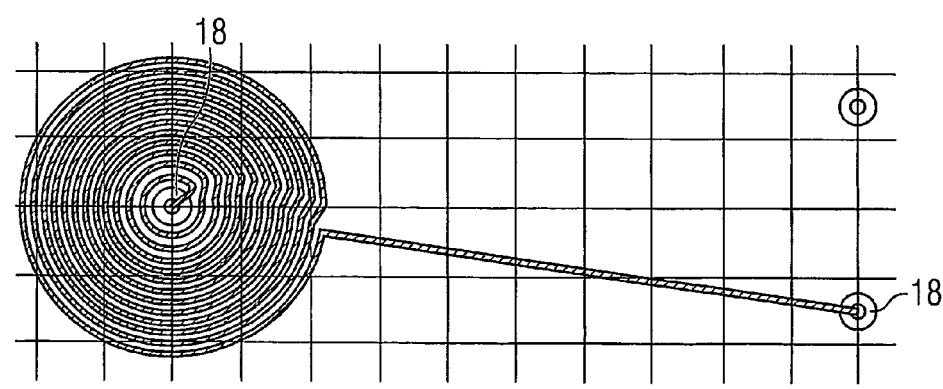
FIG. 3 shows another exemplary embodiment of a winding layout as it may be used in the inductor of FIG. 1.

Winding layouts which may be used for the windings 6, 8 are depicted in FIGS. 2 and 3 and will be described in the following.

Reference numeral 10 in FIG. 1 designates copper tracks which may be used for interconnections.

A thickness of the substrate 2 and by that a distance of the metal sheets 4 laminated onto the sides of the substrate 2 may be selected such that the distance between the metal sheets can be considered as an air gap in the magnetic path occurring in the magnetic path during operation of the inductor. Thus, preferably a thin substrate 2 is used, such as for example flex foils, which allows these inductors not to have a too large "air gap" i.e. distance between the metal sheets 4.

Due to the fact that, according to an aspect of this exemplary embodiment of the present invention, the substrate 2 is a flexible substrate, such as a flex foil, and due to the fact that metal sheets 4 are used and not sintered ferrites as known in the art, a bendable and flexible inductor may be provided. The flexibility is furthermore improved by the fact that the magnetic core, i.e. the metal sheets 4 have a very small thickness. Thus, advantageously, the flexible inductor according to an aspect of this exemplary embodiment of the present invention, may be used for example for variable electronics such as in clothes, in electronics for healthcare, in flexible displays or bendable lamps, e.g. for automotive applications. Furthermore, such flex foil inductors with integrated winding and flexible magnet core may be in particular advantageous for mobile phone display circuits.

Reference numeral 12 in FIG. 1 designates slits in the upper metal sheet 4. According to an aspect of this exemplary embodiment of the present invention, such slits 12 are provided in both metal sheets 4 forming the core of the inductor. However, it is also possible to provide these slits 12 only in one metal sheet 4 of the inductor.

The slits 12 are provided to overcome a potential disadvantage of the high permeable metal sheets 4 which is that the material of these sheets is highly conducting. This may cause an induction of large eddy currents in the sheets 4. These eddy currents may cause unwanted losses and may also deteriorate the inductive properties of the inductor.

According to an aspect of this exemplary embodiment of the present invention, the flowing of such eddy currents will be prevented or reduced due to the introduction of the slits 12 in the metallic magnetic core, i.e. in the metal sheets 4.

The slits 12 may be arranged perpendicular to a direction of the eddy current flow occurring during the operation of the inductor or to prevent reduction of the eddy current flow: The reduced eddy currents flow perpendicular to the magnetic fields in the inductor during the operation of the inductor. Therefore, preferably, the slits 12 may be arranged in a direction substantially parallel to the direction of the magnetic flux. Due to this, the eddy currents may be minimized while the slits 12 have only a very limited impact on the magnetic flux occurring in the core during operation of the inductor. In a circular inductor such the one depicted in FIG. 1, the magnetic flux in the core is radially orientated. Due to this, as depicted in FIG. 1, are arranged in radial directions.

The width of the slits should be as small as technologically possible. As an estimation, the widths of the remaining core segment should be smaller than the penetration depth which describes the fact that high frequency currents tend to flow on the surface or edges of a conductor. Since the smallest width is also limited due to technological constraints, a layered, such as the one depicted in FIG. 1, may be preferred where the number of slits increases radially to the outside of the magnetic core, i.e. to the outside of the magnetic sheets 4.

As already indicated above, the metal sheets 4 may be laminated to the substrate 2 such as to a flex foil. This may be made in the same manner as a lamination of copper layers 2, for example the flex foil. In order to improve an adhesion of the metal sheets to the surfaces of the flex foil, the metal sheet may, for example, be silicated on the respective surface to be laminated to the substrate 2.

Apart from the above-mentioned application of these inductors, due to the fact that such inductors may be favorable for the application in lower frequencies such a below 10 MHz, a preferred application of these inductors may be power converters.

FIGS. 2 and 3 show top view of winding layouts according to an exemplary embodiment of the present invention, if they may be used for the winding 6, 8 (i.e. the copper layers 6, 8) of the inductor depicted in FIG. 1. As may be taken from FIGS. 2 and 3, the windings may have the shape of a spiral. A comparison of the winding direction of views 2 and 3 shows that, according to an aspect of this exemplary embodiment of the present invention, a winding direction of both layers is opposite to each other: In FIG. 2 the winding direction is clockwise while in FIG. 3 the winding direction is counter-clockwise.

The winding layout depicted in FIGS. 2 and 3 may be used to form a 10 μH inductor realized with two copper layers in a standard enormity with 80 μm track width and 80 μm track distance. As depicted in FIG. 1, the two spirals depicted in FIGS. 2 and 3 are arranged in the substrate 2 above each other. They are interconnected to each other by a via between contacts 16 and 18. Such winding layout may, for example, be in particular advantageous for the use in a mobile phone display circuit. The contacts 16 and 18 outside of the spirals may be used for further interconnections for example two copper tracks 10 in FIG. 1.

Due to the fact that the winding layouts are realized in copper layers by, for example, wet chemical etching, photographic processes and suitable manufacturing processes, complex winding layouts may be obtained, for example transformers. Furthermore, as indicted in FIGS. 2 and 3, intermediate connections may be realized for example by means of vias. With this, circuit arrangements may be possible where only one component with a complex winding is used instead of two or more simple inductors which advantageously may reduce a component count and a size of the circuits.

Figure 4:
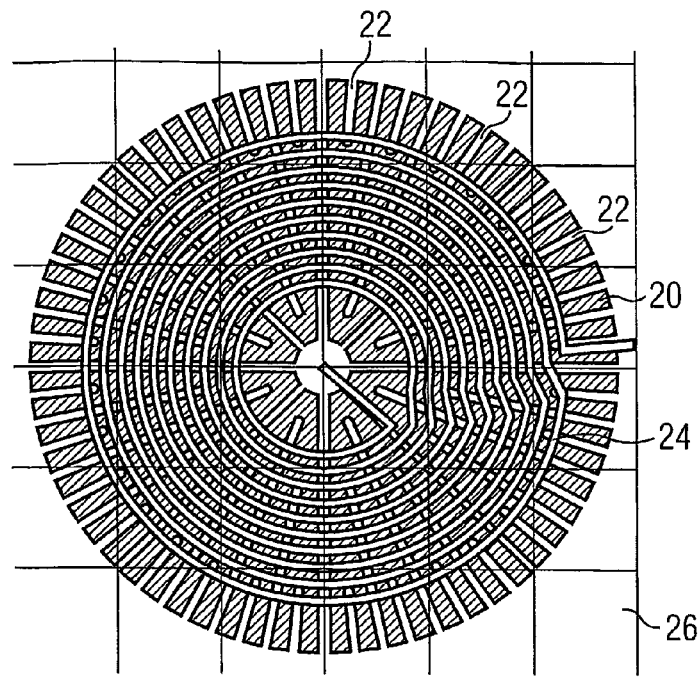
FIG. 4 is a top view of an exemplary embodiment of a magnetic core layer, i.e. metal sheet with radial slits and the underlying winding in a top copper layer according to an exemplary embodiment of the present invention.

FIG. 4 shows a top view on a circular metal sheet 20 including slits 22 and an underlying winding 24 which is a spiral winding. The sheet 20 is arranged on a substrate 26 and the winding 24 is embedded into the substrate 26.

As may be taken from FIG. 4, the slits are arranged such that they extend radially to the outside of the sheet metal 20. Furthermore, the number of slits increases radially to the outside of the magnetic core, i.e. the sheet metal 20 such that the slits 20 have different lengths.

The slits 20 are arranged such that they are perpendicular to the direction of the eddy current occurring during the operation of the inductor. Since induced eddy currents flow perpendicular to the magnetic fields, the slits 22 should be arranged preferably substantially parallel to the direction of the magnetic flux which in a circular inductor with a circular metal sheet 20, as depicted in FIG. 4, is radially orientated.

Figure 5:
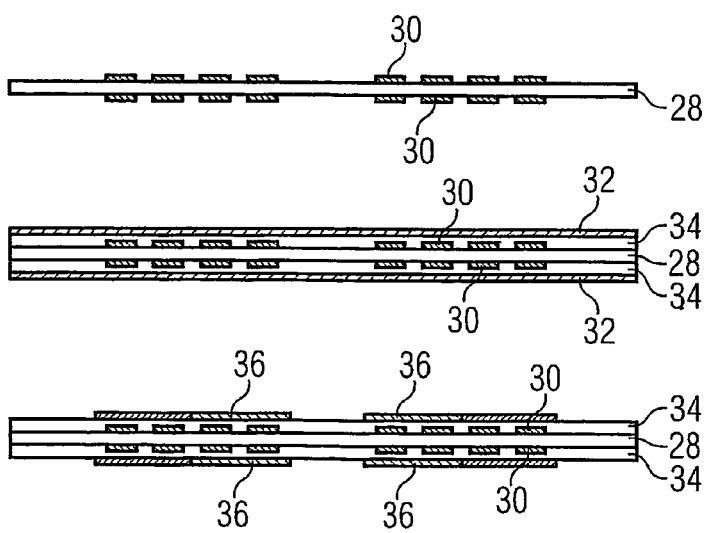
FIG. 5 shows sectional views of different manufacturing states of a second exemplary embodiment of an inductor according to the present invention.

FIG. 5 shows sectional views of different manufacturing states of a second exemplary embodiment of an inductor according to the present invention.

The upper manufacturing state depicted in FIG. 5 shows the substrate 28, namely a flex foil with copper winding 30. The second state shows two high permeable metal sheets 32 laminated onto the flex foil with copper winding. Reference numeral 34 in FIG. 5 designates glue and insulation material which is respectively sandwiched between the flex foil 28 with copper windings 30 and the high permeable metal sheet 32.

The third manufacturing state depicted in FIG. 5 shows the final inductor according to the second exemplary embodiment of the present invention where the high permeable metal sheet 32 has been structured to form the structured magnetic core 36.

The flex foil with the copper winding 30 depicted at the first state in FIG. 5 may be manufactured in a known manner. For example, by laminating the copper tracks forming the copper winding 30 to the flex foil. However, the copper winding may also be formed by a photolithographic process and etching.

Then for forming the second manufacturing state, a high permeable metal sheet made for example of μ-metal, nanocristaline metal or amorphous metal may be laminated to either side of the flex foil 20 with copper windings 30. Preferably, as depicted in FIG. 4, the lamination causes glue and/or insulation material to be sandwiched between the high permeable metal sheet 32 and the copper windings. 30.

For structuring the high permeable metal sheet to form the structured magnetic core 36, a wet chemical etching may be performed which is suitable for mass manufacturing. With new metal, the same wet etching can be performed as with a copper layer. In particular, the same photolithographic process and the same solvent may be used.

Instead of a wet chemical etching, the structuring of the high permeable metal sheet 32 may be performed by ways of cutting. The structuring of the high permeable metal sheet 32 to form the structured magnetic core 36 includes the forming of the slits.

Figure 6:
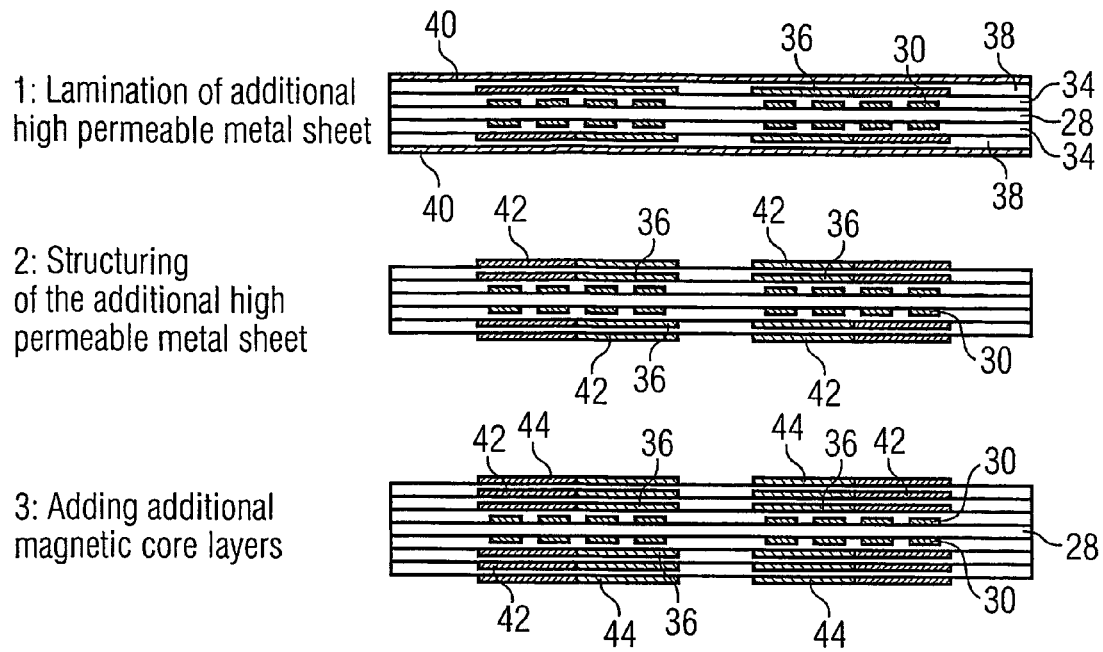
FIG. 6 shows sectional views of manufacturing states of a third exemplary embodiment of an inductor according to the present invention.

FIG. 6 shows sectional views of manufacturing states of a third exemplary embodiment of an inductor according to the present invention. In FIGS. 6 the same reference numerals are used to designate the same or corresponding elements as in FIG. 5.

It may be taken from FIG. 6, the first manufacturing state depicted in FIG. 6 corresponds to the final manufacturing state depicted in FIG. 5 with the exception that in FIG. 6, additional high permeable metal sheets 40 have been laminated by means of glue and lamination material 38 onto the final manufacturing state depicted in FIG. 5. Then, in the second manufacturing state depicted in FIG. 6, the additional high permeable metal sheets 40 were structured, for example, by wet chemical etching to form the structured core 42. As may be taken from this second manufacturing state, an inductor is provided having a two-layered core 36 and 42.

By adding another additional high permeable metal sheet and by structuring this additional high permeable metal sheet further structured cores 44 may be added to the inductor such that multilayer cores are provided.

Such multilayer cores are in particular advantageous for applications where conductors are needed with a higher magnetic flux in the core. A high magnetic flux in the core may not only be realized by simply increasing the thickness of the magnetic core due to the skin effect of the magnetic flux according to which the flow occurs only off the surface of the core layers and according to which the inside of the cores would be field free and thus unused. According to this skin effect, the use of several thin stacked insulated layers of high permeable sheets allows to significantly increase the magnetic flux in the core.

As may be taken from FIGS. 5 and 6, the manufacturing of such multilayer inductors is similar to the manufacturing of a more simple one-layer inductor, as shown in the final manufacturing state depicted in FIG. 5 with the exception that further elimination steps and structuring steps have to be carried out.

Alternatively to the manufacturing method suggested by FIG. 6, all layers may be etched in one step. However, an insulating adhesive has to be provided between the layer which may be structured with the same etching solvent that is used to etch the high permeable metal sheet layers.

Figure 7:
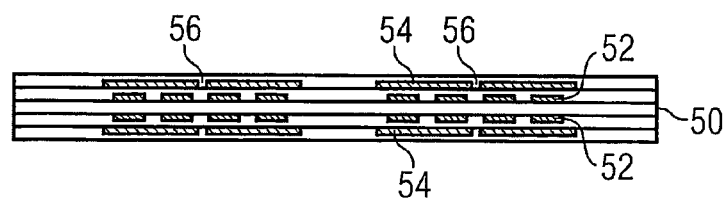
FIG. 7 shows a sectional view of a fourth exemplary embodiment of an inductor according to the present invention.

FIG. 7 shows a sectional view of an inductor according to a fourth exemplary embodiment of the present invention. As may be taken from FIG. 7, winding layers 52 are arranged on a substrate 50 on to which structured high permeable metal sheet layers 54 have been laminated to form the magnetic core of the inductor. As may be taken from the sectional side view of FIG. 7, the core, i.e. the structured high permeable metal sheet layers 54 are provided with slits 56. According to an aspect of this exemplary embodiment of the present invention, these slits 56 are perpendicular to the magnetic flux direction occurring in the core. Advantageously, these slits 56 may lower the magnetic flux and also the inductivity of the inductor according to this exemplary embodiment of the present invention. This may be advantageous for certain winding layouts where it may be necessary to prevent the inductor from saturation.

Figure 8:
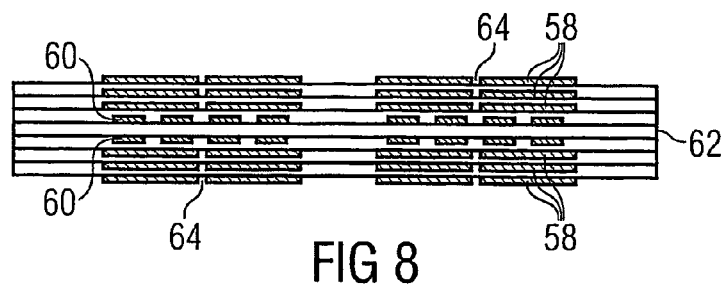
FIG. 8 shows a sectional view of a fifth exemplary embodiment of an inductor according to the present invention.

FIG. 8 shows a sectional view of a fifth exemplary embodiment of an inductor according to the present invention. As may be taken from FIG. 8 this inductor is a multilayer inductor comprising three core layers 58 on each side of two windings layers 60 provided on a substrate 62. As may be taken from FIG. 8, the core layers 58 are provided with slits 64.

In some cases it may appear that the magnetic flux is concentrated in the most inner core layer 58, i.e. the core layers 58 close to the winding layers 60. This may happen due to the fact that these inner layers 58 may have a shielding effect with respect to the out layers. This may happen in particular when an insulation provided between the core layers 58 is too thick.

According to an aspect of this exemplary embodiment of the present invention, slits 64 which are perpendicular to the flux direction are formed in the core layers 58. Due to this, the magnetic flux is forced to also flow into the other more outer layers which may improve the flux distribution over the layers. Advantageously, a homogeneous flux distribution may be achieved. To further improve the homogeneity, the width of the slits may be varied in the different core layers 58. In particular, the width of the slits in the inner layers 58 may be larger than the slit widths of slits 64 in outer layers 58.

Figure 9:
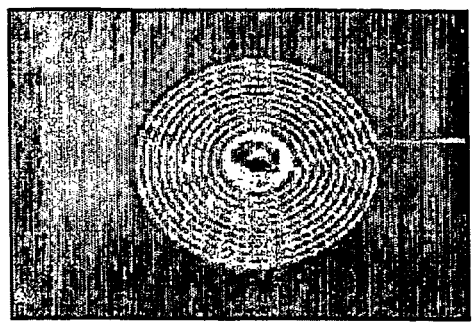
FIG. 9 shows a flex foil with a winding according to an exemplary embodiment of the present invention as it may be used for example in the inductors of FIGS. 1, 5, 6, 7 and 8.
Figure 10:
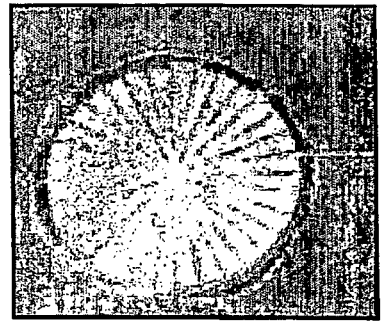
FIG. 10 shows a circular metal sheet as is may be used for the core of the inductors depicted in FIGS. 1, 5, 6, 7 and 8.

FIGS. 9 and 10 show samples of an inductor winding (FIG. 9) and a structured flexible core (FIG. 10). The flex foil with the copper winding depicted in FIG. 9 was manufactured in accordance with a standard flex foil process. The core (FIG. 10) was made of 25 μm VitroVac high permeable metal foil by laser cutting. The core sheets were then attached to the flex foil by hand with a tesafilm adhesive tape.

Figure 11:
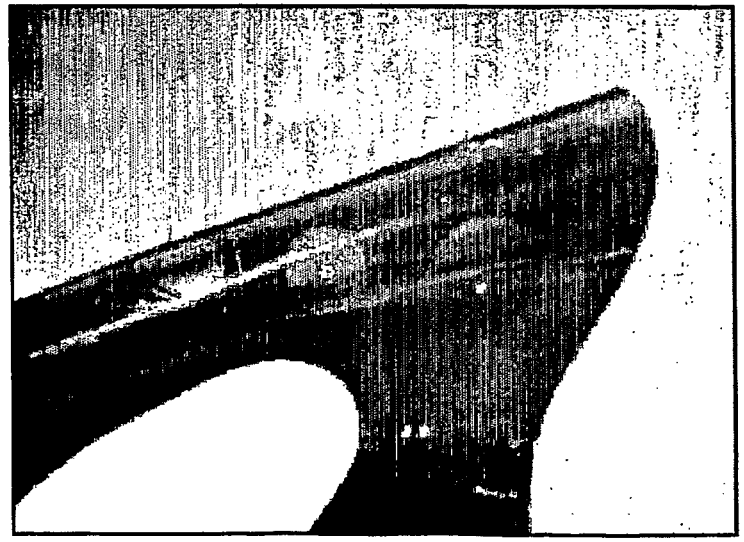
FIG. 11 shows the flex foil with winding a FIG. 9 and the flex inductor of FIG. 10 arranged on a flexible substrate according to an exemplary embodiment of the present invention.

FIG. 11 shows a picture of a flex foil substrate including spiral windings and a structured core laminated thereon. As may be taken from FIG. 1, the flexibility of the inductor according to the present invention is quite substantial.

The invention claimed is:

1. Inductor, comprising:
a flexible substrate having a first side and a second side;
a flexible winding having a first winding layer and a second winding layer, the first winding layer and the second winding layer being spaced apart and parallel; and
a core;
wherein the flexible winding is embedded in the flexible substrate;
wherein the core comprises a first flexible metal sheet which is arranged on the first side of the flexible substrate and a second flexible metal sheet which is arranged on the second side of the flexible substrate such that the flexible winding is at least partially covered by the first flexible metal sheet and the second flexible metal sheet; and
wherein the first and second flexible metal sheets are soft-magnetic.

2. The inductor of claim 1,
wherein the flexible winding is a structured copper layer in the flexible substrate.

3. The inductor of claim 1,
wherein the first and second flexible metal sheets are high permeable metal sheets; and
wherein the first and second flexible metal sheets are laminated to the first and second sides of the flexible substrate.

4. The inductor of claim 1,
wherein the first and second flexible metal sheets are made of at least one material selected from the group consisting of μ-metal, amorphous metal and nanocristaline metal.

5. The inductor of claim 1,
wherein a thickness of the flexible substrate and therewith a distance between the first and second flexible metal sheets is such that the distance can be considered as an air gap in a magnetic path of the core.

6. The inductor of claim 1,
wherein the first and second flexible metal sheets have first slits;
wherein the first slits are arranged substantially perpendicular to an eddy current flow occurring in the first and second flexible metal sheets during operation of the inductor to reduce the eddy current flow.

7. The inductor of claim 6,
wherein copper structures of the flexible winding have the form of a spiral;
wherein the first and second flexible metal sheets are circular; and
wherein a number of the first slits in the first and second flexible metal sheets increases radially.

8. The inductor of claim 1,
wherein the first and second flexible metal sheets have second slits;
wherein the second slits are perpendicular to a direction of a magnetic flux occurring the in the first and second flexible metal sheets during operation of the inductor.

9. The inductor of claim 1,
wherein a plurality of first and second flexible metal sheets are arranged,
wherein the plurality of first flexible metal sheets are arranged one above the other and
wherein the plurality of second flexible metal sheets are one above the other.

10. The inductor of claim 9,
wherein the plurality of first and second flexible metal sheets are provided with third slits;
wherein the third slits are perpendicular to a direction of a magnetic flux occurring the in the plurality of first and second flexible metal sheets during operation of the inductor;
wherein inner ones of the first and second flexible metal sheets have third slits with a first width and outer one of the first and second flexible metal sheets have slits with a second width; and
wherein the first width is larger than the second width.

11. Inductor, comprising:
a substrate having a first side and a second side;
a winding; and
a core;
wherein the winding is embedded in the substrate;
wherein the core comprises a first metal sheet which is arranged on the first side of the substrate and a second metal sheet which is arranged on the second side of the substrate such that the winding is at least partially covered by the first metal sheet and the second metal sheet;
wherein the first and second metal sheets have first slits;
wherein the first slits are arranged substantially perpendicular to an eddy current flow occurring in the first and second metal sheets during operation of the inductor to reduce the eddy current flow;
wherein copper structures of the winding have the form of a spiral;
wherein the first and second metal sheets are circular;
wherein a number of the first slits in the first and second metal sheets increases radially; and
wherein the first and second metal sheets are softmagnetic.

12. Method of manufacturing an inductor, the method comprising the steps of:
providing a flexible substrate having a first side and a second side, wherein a flexible winding is embedded in the flexible substrate, the flexible winding having a first winding layer and a second winding layer, the first winding layer and the second winding layer being spaced apart and parallel; and
laminating a first flexible metal sheet on to the first side of the flexible substrate and a second flexible metal sheet on to the second side of the flexible substrate such that the flexible winding is at least partially covered by the first flexible metal sheet and the second flexible metal sheet to thereby form a core;
wherein the first and second flexible metal sheets are soft-magnetic.

13. The method of claim 12, further comprising the step of:
structuring copper layers to form the flexible winding in the flexible substrate.

14. The method of claim 12, further comprising the step of:
providing first slits in the first and second flexible metal sheets;
wherein the first slits are made by wet chemical etching or laser cutting.

15. Inductor, comprising:
a substrate having a first side and a second side;
a winding; and
a core;
wherein the winding is embedded in the substrate;
wherein the core comprises a first metal sheet which is arranged on the first side of the substrate and a second metal sheet which is arranged on the second side of the substrate such that the winding is at least partially covered by the first metal sheet and the second metal sheet;
wherein a plurality of first and second metal sheets are arranged, wherein the plurality of first metal sheets are arranged one above the other;
wherein the plurality of second metal sheets are one above the other;
wherein the plurality of first and second metal sheets are provided with third slits;
wherein the third slits are perpendicular to a direction of a magnetic flux occurring the in the plurality of first and second metal sheets during operation of the inductor;
wherein inner ones of the first and second metals sheets have third slits with a first width and outer one of the first and second metal sheets have slits with a second width;
wherein the first width is larger than the second width; and
wherein the first and second metal sheets are softmagnetic.

* * * * *